(12) United States Patent
Hongoh

(10) Patent No.: US 11,566,331 B2
(45) Date of Patent: Jan. 31, 2023

(54) CALCIUM-MAGNESIUM-ALUMINO-SILICATE RESISTANT THERMAL BARRIER COATINGS

(71) Applicant: United Technologies Corporation, Farmington, CT (US)

(72) Inventor: Masamichi Hongoh, Manchester, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 507 days.

(21) Appl. No.: 16/812,946

(22) Filed: Mar. 9, 2020

(65) Prior Publication Data
US 2020/0208272 A1 Jul. 2, 2020

Related U.S. Application Data

(62) Division of application No. 15/034,059, filed as application No. PCT/US2014/063145 on Oct. 30, 2014, now Pat. No. 10,584,421.

(Continued)

(51) Int. Cl.
*C23C 24/10* (2006.01)
*C23C 4/11* (2016.01)
(Continued)

(52) U.S. Cl.
CPC ............... *C23C 24/10* (2013.01); *C23C 4/02* (2013.01); *C23C 4/11* (2016.01); *C23C 4/134* (2016.01);
(Continued)

(58) Field of Classification Search
CPC .......... F05D 2220/32; F05D 2230/312; F05D 2230/313; F05D 2300/211;
(Continued)

(56) References Cited

U.S. PATENT DOCUMENTS 5,484,980 A 1/1996 Pratt et al.
5,660,885 A 8/1997 Hasz et al.
(Continued)

FOREIGN PATENT DOCUMENTS

EP 2431495 A1 3/2012

OTHER PUBLICATIONS

European Search Report for European Application No. 14858729.8, dated Jun. 2, 2017, 11 pages.
(Continued)

*Primary Examiner* — Igor Kershteyn
(74) *Attorney, Agent, or Firm* — Cantor Colburn LLP

(57) ABSTRACT

A method for forming a coating system on a component includes depositing a reactive layer with predetermined CMAS reaction kinetics on at least a portion of a thermal barrier coating. The method also includes activating the reactive layer with a scanning laser. A component, such as a gas turbine engine component, includes a substrate, a thermal barrier coating and a reactive layer. The thermal barrier coating is deposited on at least a portion of the substrate. The reactive layer is deposited on at least a portion of the thermal barrier coating. The reactive layer has predetermined CMAS reaction kinetics activated by laser scanning.

10 Claims, 2 Drawing Sheets

Related U.S. Application Data

(60) Provisional application No. 61/899,535, filed on Nov. 4, 2013.

(51) Int. Cl.

| | | |
|---|---|---|
| *C23C 4/134* | (2016.01) | |
| *C23C 4/02* | (2006.01) | |
| *C23C 14/02* | (2006.01) | |
| *C23C 14/08* | (2006.01) | |
| *C23C 14/30* | (2006.01) | |
| *C23C 28/04* | (2006.01) | |

(52) U.S. Cl.
CPC .......... *C23C 14/024* (2013.01); *C23C 14/083* (2013.01); *C23C 14/30* (2013.01); *C23C 28/042* (2013.01); *F05D 2220/32* (2013.01); *F05D 2230/312* (2013.01); *F05D 2230/313* (2013.01); *F05D 2300/211* (2013.01); *F05D 2300/2118* (2013.01); *F05D 2300/502* (2013.01)

(58) Field of Classification Search
CPC ....... F05D 2300/2118; F05D 2300/502; C23C 28/042; C23C 14/024; C23C 14/083; C23C 14/30; C23C 4/02; C23C 4/11; C23C 4/134

See application file for complete search history.

(56) References Cited

U.S. PATENT DOCUMENTS

| | | | | |
|---|---|---|---|---|
| 9,869,188 | B2* | 1/2018 | Brosnan | .................. C04B 41/52 |
| 2009/0017260 | A1* | 1/2009 | Kulkarni | ............. C23C 28/3455 |
| | | | | 428/161 |
| 2009/0110953 | A1* | 4/2009 | Margolies | ............... C23C 30/00 |
| | | | | 427/314 |
| 2009/0186237 | A1* | 7/2009 | Lee | ......................... C23C 30/00 |
| | | | | 428/678 |
| 2010/0158680 | A1* | 6/2010 | Kirby | ...................... F01D 5/288 |
| | | | | 423/328.1 |
| 2011/0151132 | A1* | 6/2011 | Nagaraj | .................. C23C 28/36 |
| | | | | 204/192.15 |
| 2012/0034491 | A1* | 2/2012 | Hongoh | ................ C23C 28/345 |
| | | | | 427/446 |
| 2014/0099476 | A1 | 4/2014 | Subramanian et al. | |
| 2016/0273114 | A1* | 9/2016 | Hongoh | ................ C23C 28/042 |
| 2019/0211696 | A1* | 7/2019 | Keshavan | ............... F01D 5/288 |
| 2021/0332482 | A1* | 10/2021 | Hazel | .................. C23C 28/3455 |

OTHER PUBLICATIONS

International Search Report for International Application No. PCT/US2014/063145; dated Feb. 25, 2015.

Kramer et al., Infiltration-Inhibiting Reaction of Gadolinium Zirconate Thermal Barrier Coatings with CMAS Melts, Journal Am. Ceram. Soc, 91[2] 576-583 (2008).

Mechnich et al., Volcanic Ash-Induced Decomposition of EB-PVD $Gd_2Zr_2O_7$ Thermal Barrier Coatings to Gd-Oxyapatite, Zircon, and Gd, Fe-Zirconolite, Journal Am. Ceram. Soc., 96[6] 1958-1965 (2013).

Morks et al., "Microscopic observation of laser glazed yttria-stabilized zirconia coatings", Applied Surface Science, vol. 256, 2010, pp. 6213-6218.

Tsai et al., "Improving the erosion resistance of plasma-sprayed zirconia thermal barrier coatings by laser glazing", Surface & Coatings Technology, vol. 202, 2007, pp. 719-724.

Written Opinion for International Application No. PCT/US2014/063145; dated Feb. 25, 2015.

\* cited by examiner

CALCIUM-MAGNESIUM-ALUMINO-SILICATE RESISTANT THERMAL BARRIER COATINGS

CROSS REFERENCE TO RELATED APPLICATIONS

This application is a divisional application of U.S. Non-Provisional application Ser. No. 15/034,059, filed May 3, 2016, which is a National Stage application of PCT/US2014/063145, filed Oct. 30, 2014, which claims the benefit of U.S. Provisional Application No. 61/899,535, filed Nov. 4, 2013, all of which are incorporated by reference herein in their entirety.

BACKGROUND OF THE INVENTION

1. Field of the Invention

The present disclosure relates to coating systems f, and more particularly to coating systems for gas turbine engine components, for example.

2. Description of Related Art

Traditionally, the durability and the maximum temperature capability of a thermal barrier coating (TBC) system used in gas turbine engines is often limited by deposits of naturally occurring calcium-magnesium-alumino-silicate (CMAS). These deposits melt and wet the material, typically yttria-stabilized zirconia, used as the thermal barrier coating, causing it to be drawn by capillarity into all of the open void space. Upon cooling, when the CMAS solidifies, the penetrated layer develops a high modulus of elasticity. Since the thermal barrier coatings rely on spatially configured voids to achieve strain tolerance with the superalloy substrate, those regions penetrated by the CMAS can be detrimental, causing the thermal barrier coating to be susceptible to extensive spallation when subjected to subsequent thermal cycles. Thermal barrier coating spallation can lead to a considerable reduction in the gas turbine engine component durability and, if not addressed, to a potential direct attack on the underlying substrate.

A traditional approach to deal with this problem is to deposit an extra layer over the thermal barrier coating. However, this extra layer is not activated prior to the introduction of the component into service. As a result, it does not become activated until CMAS is encountered in service. CMAS comes with a variety of chemical compositions depending upon its geographical origin. Consequently, the effectiveness of this extra layer is unknown and may be less than desirable in certain conditions.

One approach is to deposit a reactive layer with known CMAS reaction kinetics onto the thermal barrier coating and apply a heat treatment to the reactive layer prior to using the component in service, for example, a twenty-four hour heat treatment between 2100° F. and 2200° F. (1149° C. and 1204° C.). Examples of such systems and methods are disclosed in U.S. Patent Publication No. 2012/0034491 which is incorporated by reference herein in its entirety. Such reactive layer coating and heat treatment can mitigate the effects of spallation due to CMAS.

Such conventional methods and systems have generally been considered satisfactory for their intended purpose. However, there is still a need in the art for coating systems that allow for improved CMAS resistance.

SUMMARY

A method for forming a coating system on a metallic component includes depositing a reactive layer with predetermined CMAS reaction kinetics onto at least a portion of a thermal barrier coating and activating the reactive layer with a laser.

It is contemplated that the method can include forming the thermal barrier coating from a stabilized zirconia, and/or from a stabilized zirconia that can have at least one crystallization promoting compound, such as $La_2Zr_2O_7$, $Gd_2Zr_2O_7$, $Al_2O_3$, $TiO_2$, $Y_2Zr_2O_7$, and/or mixtures thereof. Activating the reactive layer can include fusing the reactive layer and at least a portion of the thermal barrier coating. The method can also include depositing a bond coat on at least a portion of a surface of a substrate followed by depositing the thermal barrier coating onto at least a portion of the bond coat. Depositing the reactive layer can include depositing a thin film of chemically conditioned CMAS powder over at least a portion of the thermal barrier coating. Activating the reactive layer with a laser can complete an additive manufacturing process bonding the reactive layer to the thermal barrier coating. The reactive layer can include chemically conditioned CMAS and/or can include one or more reactive materials such as, $Y_2Zr_2O_7$, $Gd_2Zr_2O_7$ and/or $TiO_2$.

According to some embodiments, the method can include preparing a powder mixture having a chemical composition with a melting temperature, which after thermo-chemical reaction with the thermal barrier coating, is higher than the melting temperature of environmental CMAS. Preparing the powder mixture can include preparing a chemical composition including chemically conditioned CMAS and $Y_2Zr_2O_7$, and/or a chemical composition wherein the melting temperature is at least 50° F. (10° C.) higher than the melting temperature of environmental CMAS. Depositing the reactive layer can include depositing the powder mixture onto at least a portion of the thermal barrier coating. Activating the reactive layer with the laser can complete an additive manufacturing process that can bond the reactive layer to the thermal barrier coating.

A component subjected to elevated temperatures during operation includes a substrate, a thermal barrier coating deposited on at least a portion of the substrate, and a reactive layer deposited on at least a portion of the thermal barrier coating. The reactive layer has predetermined CMAS reaction kinetics activated by laser scanning.

It is contemplated that in some embodiments the reactive layer can include a CMAS powder mixture. At least a portion of the reactive layer and a portion of the thermal barrier coating are fused when the reactive layer is activated by laser scanning. There can be a bond coat between at least a portion of the substrate and the thermal barrier coating. Further, the component can be a gas turbine engine component. The reactive layer can have graded characteristics from an interface with the thermal barrier coating to an external surface of the reactive layer.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
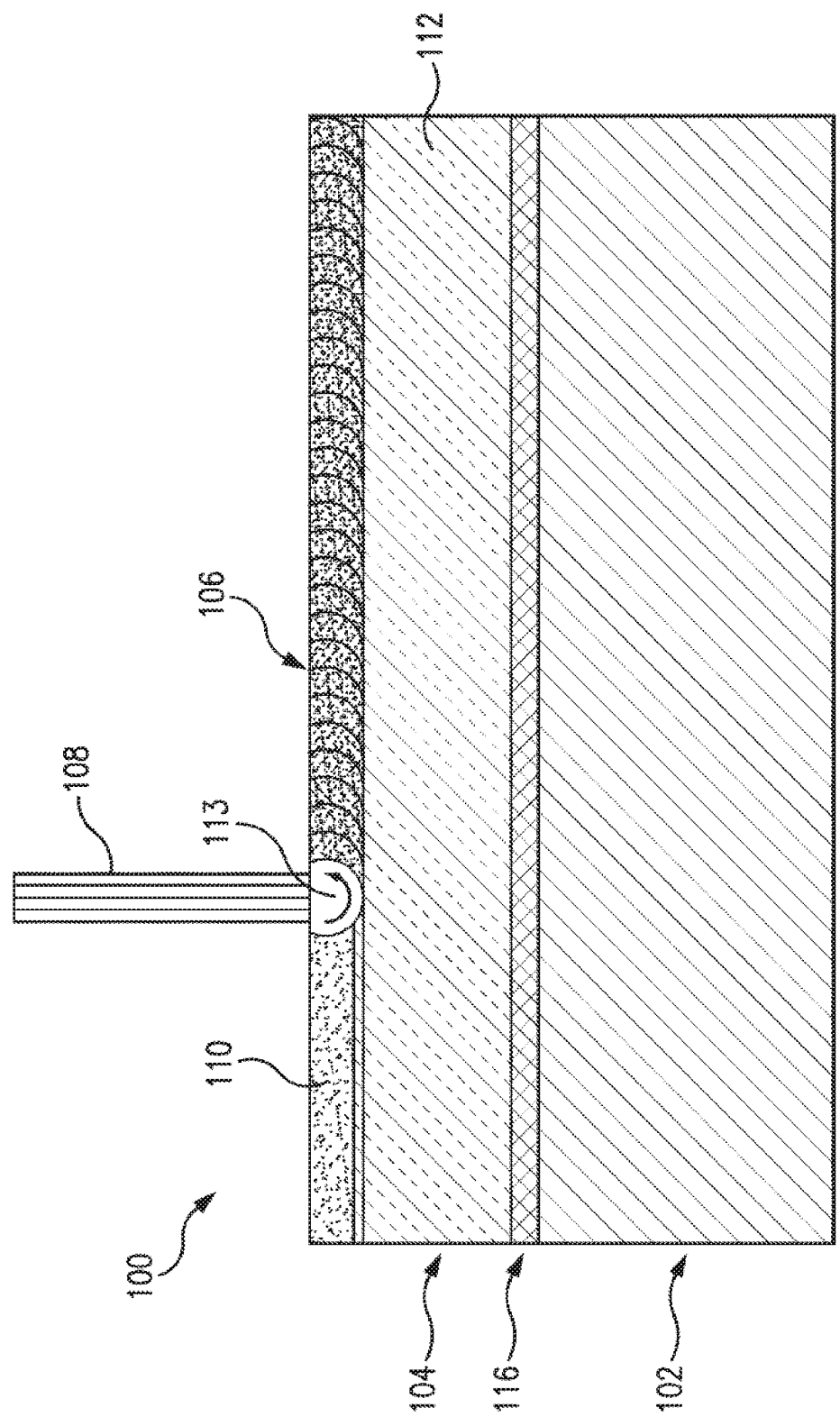
FIG. 1 is a partial cross-sectional plan view of an exemplary embodiment of a component, illustrated as a gas turbine engine component, constructed in accordance with the present disclosure, schematically showing the reactive layer with chemically conditioned CMAS and $Y_2Zr_2O_7$ being activated and fused by laser scanning with the thermal barrier coating.

Reference will now be made to the drawings wherein like reference numerals identify similar structural features or aspects of the subject disclosure. For purposes of explanation and illustration, and not limitation, a partial cross-sectional plan view of an exemplary embodiment of a gas turbine engine component in accordance with the disclosure is shown in FIG. 1 and is designated generally by reference character 100. Other embodiments of gas turbine engine components in accordance with the disclosure, or aspects thereof, are provided in FIG. 2, as will be described.

As shown in FIG. 1, a gas turbine engine component 100 includes a substrate 102, a thermal barrier coating 104 deposited on substrate 102, and a reactive layer 106 deposited on thermal barrier coating 104. Reactive layer 106 has predetermined CMAS reaction kinetics activated by a laser, e.g. a scanning laser, as indicated schematically in FIG. 1 by laser 108. There is also a bond coat 116 between substrate 102 and thermal barrier coating 104.

With continued reference to FIG. 1, reactive layer 106 includes a CMAS powder mixture 110. CMAS powder mixture 110 includes chemically conditioned CMAS and $Y_2Zr_2O_7$. Thermal barrier coating 104 includes a stabilized zirconia 112, e.g. an yttria-stabilized zirconia. Those skilled in the art will readily appreciate that $Y_2Zr_2O_7$ included in CMAS powder mixture 110 allows CMAS powder mixture 110 to react with thermal barrier coating 104 that includes yttria-stabilized zirconia 112, without requiring additional crystallization promoting materials 218, shown in FIG. 2, such as $La_2Zr_2O_7$. $Gd_2Zr_2O_7$, $Al_2O_3$, $TiO_2$, $Y_2Zr_2O_7$.

Those skilled in the art will readily appreciate that while crystallization promoting materials 218 can be effective for reacting with CMAS powder mixture 210, as described below, prices of such materials 218 tend to vary causing uncertainty in manufacturing costs. Further, those skilled in the art will readily appreciate that a thermal barrier coating 204 with crystallization promoting materials 218 can tend to have less fracture toughness relative to a thermal barrier coating with only yttria-stabilized zirconia 112. In addition, those skilled in the art will readily appreciate that a thermal barrier coating with crystallization promoting materials 218 also tends to react chemically with thermally grown oxide and might have a slower reaction time, resulting in a thicker reactive layer.

With continued reference to FIG. 1, once activated, reactive layer 106 includes fused CMAS powder mixture 110 and thermal barrier coating 104. Those skilled in the art will readily appreciate that laser scanning activates reactive layer 106 and that a melt pool 113 is formed as laser 108 scans over the surface of gas turbine engine component 100. Melt pool 113 includes at least a portion of reactive layer 106, formed in the proceeding laser pass, CMAS powder mixture 110, and thermal barrier coating 104. Upon cooling, melt pool 113 results in an activated reactive layer 106. Those skilled in the art will readily appreciate that activated reactive layer 106 contains chemically reacted and crystallized CMAS glass.

Reactive layer 106 has a melt temperature which is higher than the melt temperature of environmental CMAS. For example, the temperature of reactive layer 106 can be at least 50° F. (10° C.) higher than the melt temperature of environmental CMAS, e.g. naturally occurring CMAS ingested by a gas turbine engine. The melting temperature of environmental CMAS is typically about 2192° F. (1200° C.). This difference in melt temperature is configured to maintain a barrier of chemically conditioned CMAS, e.g. CMAS powder mixture 110, between the environmental CMAS and thermal barrier coating 104, therein protecting thermal barrier coating 104 from spallation. Further, those skilled in the art will readily appreciate that reactive layer 106 can have graded characteristics from an interface with thermal barrier coating 104 to an external surface of reactive layer 106. It is contemplated that thermal barrier coating 104 can be deposited using a variety of suitable manufacturing techniques such as, air plasma spraying (APS), solution precursor plasma spraying (SPPS), and/or electron beam physical vapor deposition (EBPVD).

Figure 2:
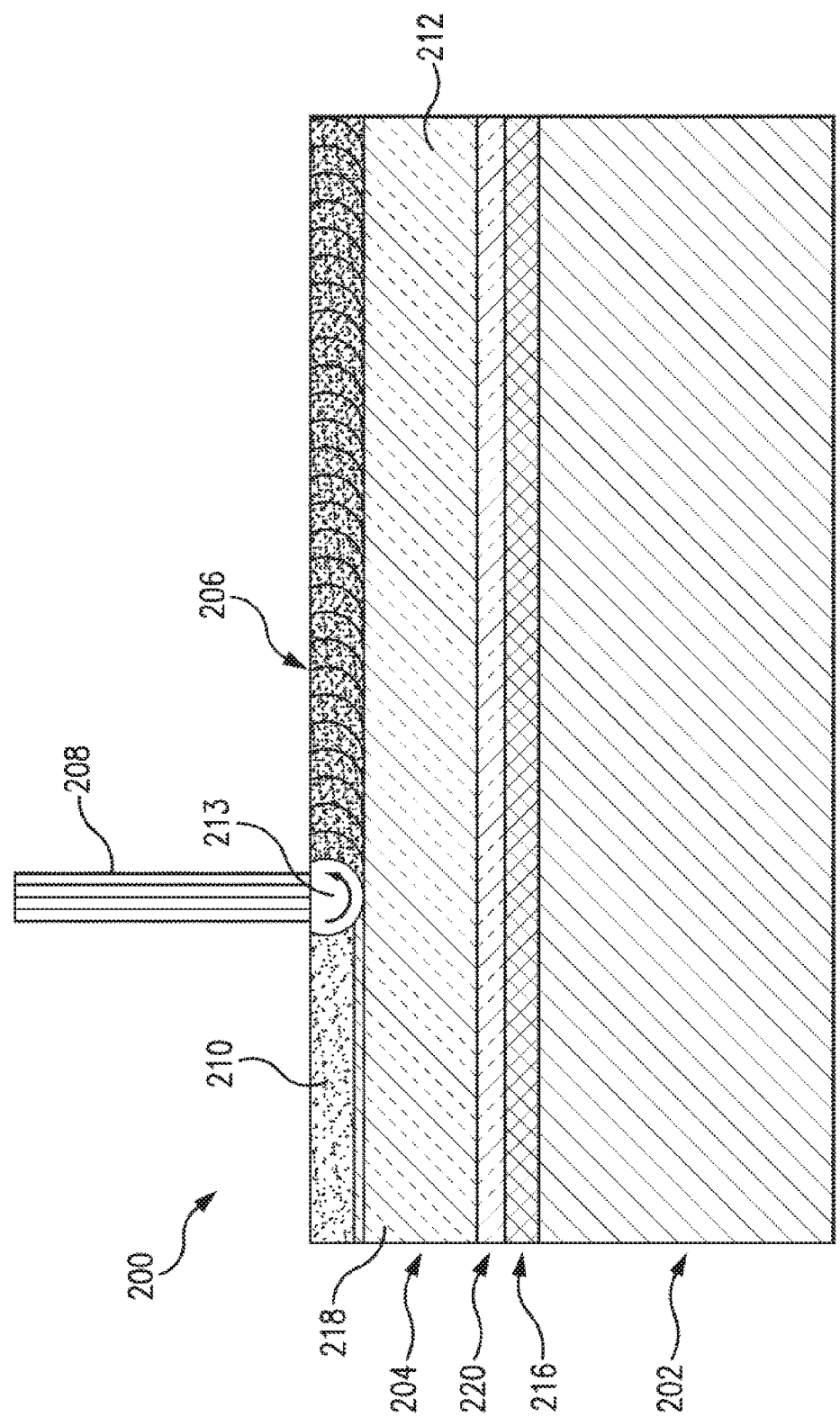
FIG. 2 is a partial cross-sectional plan view of another exemplary embodiment of a component, illustrated as a gas turbine engine component, constructed in accordance with the present disclosure, schematically showing the reactive layer with chemically conditioned CMAS being activated and fused by laser scanning.

Now with reference to FIG. 2, gas turbine engine component 200 includes a substrate 202, a thermal barrier coating 204 deposited on substrate 202 and a reactive layer 206 deposited on thermal barrier coating 204. There is also a bond coat 216 between substrate 202 and thermal barrier coating 204. Thermal barrier coating 204 includes an yttria-stabilized zirconia 212 and a crystallization promoting material 218, for example $Gd_2Zr_2O_7$. Those skilled in the art will readily appreciate that thermal barrier coating 204 can include any other suitable crystallization promoting material 218, such as $La_2Zr_2O_7$, $Al_2O_7$, $TiO_2$, $Y_2Zr_2O_7$, and/or mixtures thereof. Reactive layer 206 is a powder 210 that includes chemically conditioned CMAS. e.g. CMAS powder mixture 210, and has predetermined CMAS reaction kinetics activated by laser scanning, e.g. laser sintering by laser 208.

With continued reference to FIG. 2, gas turbine engine component 200 also includes an additional yttria-stabilized zirconia thermal barrier coating layer 220. This thermal barrier coating layer 220 does not include crystallization promoting material 218. Those skilled in the art will readily appreciate that additional yttria-stabilized zirconia thermal barrier coating layer 220 is a toughened inner layer that can provide strength to thermal barrier coating 204, which contains large volume fraction of crystallization promoting materials, e.g. crystallization promoting material 218, and may tend to make the thermal barrier coating 204 brittle. Once activated, reactive layer 206 includes CMAS powder mixture 210 and at least a portion of thermal barrier coating 204. Those skilled in the art will readily appreciate that, prior to the formation of the activated reactive layer 206, a melt pool 213 is formed as laser 208 scans over the surface of gas turbine engine component 200. Melt pool 213 is similar to melt pool 113, as described above.

Those skilled in the art will readily appreciate that, similar to reactive layer 106, described above, reactive layer 206 can include $Y_2Zr_2O_7$, $Gd_2Zr_2O_7$ and/or $TiO_2$. Reactive layer 206 also has a melt temperature similar to the melt temperature of reactive layer 106, as described above. Further, those skilled in the art will readily appreciate that reactive layer 206 can have graded characteristics as described above with respect to reactive layer 106.

Now with reference to FIGS. 1 and 2, a method for forming a coating system on a gas turbine engine component, e.g. gas turbine engine component 100 or 200, includes depositing a reactive layer. e.g. reactive layer 106 or 206, with predetermined CMAS reaction kinetics onto a thermal barrier coating, e.g. thermal barrier coating 104 or 204, and activating the reactive layer with a scanning laser, e.g. scanning laser 108 or 208. Depositing the reactive layer includes preparing a powder mixture, e.g. CMAS powder mixture 110 or 210, having a chemical composition with a melting temperature, which after thermo-chemical reaction with the thermal barrier coating, is higher than the melting temperature of environmental CMAS. For example, it is contemplated that the melting temperature can be at least 50° F. (10° C.) higher than the melting temperature of environmental CMAS.

With continued reference to FIGS. 1 and 2, depositing the reactive layer includes depositing a thin film of the chemically conditioned CMAS powder mixture over the thermal barrier coating. Activating the reactive layer with the scanning laser completes an additive manufacturing process that bonds the reactive layer to thermal barrier coating. Those skilled in the art will readily appreciate that laser scanning, e.g. laser sintering, can create in one step a thin layer of rapidly reacted and crystallized CMAS over the thermal barrier coating. The rapidly reacted and crystallized CMAS tends to provide a more effective reactive sealing layer against environmental CMAS spallation than traditional methods.

As shown in FIG. 1, the method includes forming thermal barrier coating from an yttria-stabilized zirconia, e.g. an yttria-stabilized zirconia 112. Preparing the CMAS powder mixture includes preparing a chemical composition including chemically conditioned CMAS and $Y_2Zr_2O_7$. Those skilled in the art will readily appreciate that preparing the CMAS powder mixture with chemically conditioned CMAS and $Y_2Zr_2O_7$ tends to allow the reactive layer to fuse with the thermal barrier coating.

It is also contemplated that, as shown in FIG. 2, forming the thermal barrier coating can include forming from an yttria-stabilized zirconia, e.g. an yttria-stabilized zirconia 212, with at least one crystallization promoting material. e.g. crystallization promoting material 218, selected from the group consisting of $La_2Zr_2O_7$. $Gd_2Zr_2O_7$, $Al_2O_3$. $TiO_2$, $Y_2Zr_2O_7$, and/or mixtures thereof. Preparing the powder mixture includes preparing a chemical composition including chemically conditioned CMAS. Those skilled in the art will also readily appreciate that the reactive layer can also include one or more reactive materials such as, $Y_2Zr_2O_7$, $Gd_2Zr_2O_7$ and/or $TiO_2$.

With continued reference to FIG. 2, the method can include depositing an additional yttria-stabilized zirconia thermal barrier coating layer 220. This thermal barrier coating layer 220 does not include crystallization promoting material 218, as described above.

As shown in FIGS. 1 and 2, the method can also optionally include depositing a bond coat, e.g. bond coat 116 or 216, on a surface of a substrate, e.g. a substrate 102 or 202, followed by depositing the thermal barrier coating onto the bond coat. Activating the reactive layer includes activating the reactive layer with a scanning laser, e.g. laser 108 or 208.

Scanning the reactive layer with the laser completes an additive manufacturing process bonding the reactive layer to the thermal barrier coating. During activation of the reactive layer, e.g. during laser scanning, the reactive layer and at least a portion of the thermal barrier coating are melted in a melt pool, e.g. melt pool 113 or 213, and fused together, activating the reactive layer. Those skilled in the art will readily appreciate that using the scanning laser to activate the reaction layer tends to allow for a thinner reaction layer than traditional activating treatments. This thinner reaction layer tends to improve the survivability of the thermal barrier coating after exposure to naturally occurring, i.e. environmental, molten CMAS.

The methods and systems of the present disclosure, as described above and shown in the drawings, provide for components with superior properties including improved environmental CMAS resistance and reduced spallation due to environmental CMAS. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A component subjected to elevated temperature during operation comprising:
   a substrate;
   a thermal barrier coating deposited on at least a portion of the substrate; and
   a reactive layer deposited on at least a portion of the thermal barrier coating, the reactive layer having predetermined CMAS reaction kinetics activated by laser scanning.

2. A component as recited in claim 1, wherein the reactive layer includes a CMAS powder mixture, wherein the powder mixture includes chemically conditioned CMAS and $Y_2Zr_2O_7$.

3. A component as recited in claim 1, wherein at least a portion of the reactive layer and a portion of the thermal barrier coating are fused when the reactive layer is activated by laser scanning.

4. A component as recited in claim 1, further comprising a bond coat between the substrate and the thermal barrier coating.

5. A component as recited in claim 1, wherein the thermal barrier coating includes a stabilized zirconia.

6. A component as recited in claim 1, wherein the thermal barrier coating includes a stabilized zirconia having at least one crystallization promoting material selected from the group consisting of $La_2Zr_2O_7$, $GD_2Zr_2O_7$, $Al_2O_3$, $TiO_2$, $Y_2Zr_2O_7$, and mixtures thereof.

7. A component as recited in claim 1, wherein the reactive layer includes at least one of $Y_2Zr_2O_7$, $GD_2Zr_2O_7$ and $TiO_2$.

8. A component as recited in claim 1, wherein the component is a gas turbine engine component.

9. A component as recited in claim 1, wherein the melt temperature of the reactive layer is at least 50 degrees Fahrenheit (10 degrees Celsius) higher than the melt temperature of environmental CMAS.

10. A component as recited in claim 1, wherein the reactive layer has graded characteristics from an interface with the thermal barrier coating to an external surface of the reactive layer.

* * * * *